United States Patent [19]

Katayose et al.

[11] Patent Number: 5,352,745
[45] Date of Patent: Oct. 4, 1994

[54] CURABLE POLYPHENYLENE ETHER AND CYANURATE RESIN COMPOSITION AND A CURED RESIN COMPOSITION OBTAINABLE THEREFROM

[75] Inventors: Teruo Katayose, Sakura; Yoshiyuki Ishii, Yokohama, both of Japan; Hiroji Oda, Shaker Heights, Ohio

[73] Assignee: Asahi Kasei Kogyo Kabushiki Kaisha, Tokyo, Japan

[21] Appl. No.: 145,655

[22] Filed: Nov. 3, 1993

Related U.S. Application Data

[63] Continuation of Ser. No. 818,351, Jan. 9, 1992, abandoned.

[30] Foreign Application Priority Data

Jan. 11, 1991 [JP] Japan ................... 3-012581
Jan. 11, 1991 [JP] Japan ................... 3-012582

[51] Int. Cl.$^5$ .................................... C08F 283/08
[52] U.S. Cl. .................... 525/391; 525/392; 525/395; 525/396; 525/397; 525/529; 525/530; 525/533; 525/905; 428/461
[58] Field of Search ............ 525/391, 392, 395, 396, 525/397, 529, 533, 530, 905; 428/461

[56] References Cited

U.S. PATENT DOCUMENTS

| | | | |
|---|---|---|---|
| 3,936,414 | 2/1976 | Wright et al. | 525/905 |
| 4,034,136 | 7/1977 | Wright et al. | 428/246 |
| 4,533,727 | 8/1985 | Gaku et al. | 525/523 |
| 4,786,664 | 11/1988 | Yates, III | 524/417 |
| 4,806,297 | 2/1989 | Brown et al. | 525/905 |
| 4,874,826 | 10/1989 | Sakamoto et al. | 525/534 |
| 4,912,172 | 3/1990 | Hallgren et al. | 525/396 |
| 4,978,715 | 12/1990 | Brown et al. | 525/905 |
| 5,001,010 | 3/1991 | Chao et al. | 428/417 |
| 5,043,367 | 8/1991 | Hallgren et al. | 525/396 |
| 5,218,030 | 6/1993 | Katayose et al. | 525/905 |

FOREIGN PATENT DOCUMENTS

| | | |
|---|---|---|
| 0315829 | 5/1989 | European Pat. Off. . |
| 0350696 | 1/1990 | European Pat. Off. . |
| 0374514 | 6/1990 | European Pat. Off. . |
| 0382312 | 8/1990 | European Pat. Off. . |
| 0383178 | 8/1990 | European Pat. Off. . |
| 0421337A1 | 4/1991 | European Pat. Off. . |
| 3931809 | 4/1990 | Fed. Rep. of Germany . |
| 58-69052 | 4/1983 | Japan . |
| 64-3223 | 1/1989 | Japan . |
| 2-55722 | 2/1990 | Japan . |
| 2-135216 | 5/1990 | Japan . |
| 2172892 | 10/1986 | United Kingdom . |

*Primary Examiner*—Melvyn I. Marquis
*Assistant Examiner*—Randy Gulakowski
*Attorney, Agent, or Firm*—Armstrong, Westerman, Hattori, McLeland & Naughton

[57] ABSTRACT

A novel curable polyphenylene ether resin composition caontains (a) a curable polyphenylene ether resin containing at least a reaction product of a polyphenylene ether with an unsaturated carboxylic acid or an acid anhydride, (b) at least one cyanurate selected from the group consisting of triallyl isocyanurate and triallyl cyanurate, optionally (c) a resin composition comprising an epoxy resin and a curing agent and/or (d) a compound having at least one unsaturated double bond and at least one epoxy group and/or (e) a reinforcement material. The resin composition has excellent film-forming properties, resin flowability in pressing and storage stability. A cured polyphenylene ether resin composition obtained by curing the curable polyphenylene ether resin composition has excellent chemical resistance, heat resistance, dielectric properties and dimensional stability.

23 Claims, No Drawings

CURABLE POLYPHENYLENE ETHER AND CYANURATE RESIN COMPOSITION AND A CURED RESIN COMPOSITION OBTAINABLE THEREFROM

This application is a continuation of application Ser. No. 07/818,351 filed Jan. 9, 1992, abandoned.

BACKGROUND OF THE INVENTION

1. Field of The Invention

The present invention relates to a curable polyphenylene ether resin composition, a cured polyphenylene ether resin composition and a laminate structure. More particularly, the present invention is concerned with a curable polyphenylene ether resin composition comprising a reaction product obtained by reacting a polyphenylene ether with an unsaturated carboxylic acid or an acid anhydride, and at least one cyanurate. Also, it is concerned with a resin composition containing an epoxy resin or a reinforcement material if necessary, and a cured material thereof. Further, it is concerned with a laminate structure comprising a metallic foil and at least one cured resin composition layer disposed on at least one surface of said metallic foil.

The curable polyphenylene ether resin composition of the present invention has excellent storage stability, film forming properties and melt moldability, and the cured polyphenylene ether resin composition of the present invention has excellent chemical resistance, electrical properties (such as low dielectric constant and low dielectric dissipation factor), fire retardance, dimensional stability and heat resistance. Accordingly, the cured polyphenylene ether resin composition can advantageously be used as a dielectric material, an insulating material, a heat resistant material and the like in, for example, electrical and electronic industries, space and aircraft industries, etc.

The laminate structure of the present invention can advantageously be used as a single-sided printed circuit board, a double-sided printed circuit board, a multilayer printed circuit board, a flexible printed circuit board and the like.

2. Discussion of Related Art

In recent years, miniaturization and high-packing-density mounting have been strongly desired in the field of electronic devices for communication, household, industries and the like. Accordingly, materials for such devices having excellent heat resistance, dimensional stability and electrical properties have been strongly desired in the art. For example, a copper-clad laminate made Of a substrate comprising a thermosetting resin, such as a phenol resin and an epoxy resin, has been used as a printed circuit board. However, such a thermosetting resin has a drawback in that the resin has undesirable electrical properties, particularly an undesirably high dielectric constant in a high frequency range, although the resin has a good balance of various properties.

For overcoming the above-mentioned drawback, polyphenylene ether has been attracting attention as a new material, and it has been attempted to apply a polyphenylene ether to a copper-clad laminate. Indeed, a polyphenylene ether is one of the typical engineering plastics which has not only excellent mechanical but also desired electrical properties, such as a low dielectric constant and a low dielectric dissipation factor, and has also a relatively good heat resistance. However, when a polyphenylene ether is used as a material for a printed circuit board substrate, the heat resistance thereof is insufficient. A material for a printed circuit board substrate is required to have an extremely high heat resistance, because a printed circuit board substrate is necessarily exposed to high temperatures in soldering. However, substrates made of conventional polyphenylene ethers are likely to undergo distortion at temperatures higher than about 200° C., thereby causing a considerable decrease in mechanical properties and peeling off of copper foils provided as circuits on the surface of the substrate. A polyphenylene ether has also another drawback in that it has such poor resistance to an aromatic hydrocarbon and a hydrocarbon substituted with a halogen atom that it is ultimately dissolved in such hydrocarbons, although the polyphenylene ether has excellent resistance to acids, alkalis and hot water.

For improving the heat resistance and chemical resistance of a polyphenylene ether, various proposals have been made, in which a polyphenylene ether is formulated into a composition. For example, Japanese Patent Application Laid-Open No. 287739/1986 discloses a composite structure comprising as a resin substrate a cured resin obtained by curing a resin composition comprising a polyphenylene ether and at least one member selected from the group consisting of triallyl cyanurate and triallyl isocyanurate. The cured resin has poor chemical resistance, e.g., poor resistance to boiling trichloroethylene, and poor fire retardance, so that the composite structure is not suited for use as a printed circuit board. In a method comprising preparing a solution of the resin composition and fabricating the solution into a film according to a casting method, the resin composition solution has poor film-forming properties, so that disadvantageously it is difficult to obtain a film with a smooth surface.

On the other hand, with respect to general-purpose printed circuit boards comprising a glass fiber-reinforced epoxy resin substrate, various proposals have also been made to improve the heat resistance and electrical properties thereof. For example, it was proposed to improve the heat resistance and electrical properties of such printed circuit boards by employing a resin blend comprising a polyphenylene ether and an epoxy resin. In this connection, reference is made to Japanese Patent Application Laid-Open No. 69052/1983 and Japanese Patent Application Publication No. 3223/1989, in which a composite structure comprising a resin layer comprised of a polyphenylene ether and an epoxy resin and a glass fabric is disclosed. The chemical resistance of the resin layer of the composite structure is not satisfactory, and hence the composite structure is not suitable for use as a printed circuit board.

Japanese Patent Publication No. 3223/1989 and European Patent Publication Examined No. 315829 disclose combinations of a polyphenylene ether with various types of epoxy resins. As the epoxy resins, general epoxy resins such as a polyglycidyl ether of bisphenol A, an epoxy phenol novolak resin and the like are used. Curing of these compositions is achieved by using various publicly known curing agents including amines. However, a polyphenylene ether used in the invention is not chemically modified. Therefore, the cured compositions are remarkably deficient in resistance to boiling trichloroethylene, which is required as a material for a printed circuit board since the cured compositions do not have chemical resistance at all.

U.S. Pat. No. 4,912,172 discloses a resin composition comprising (i) a polyphenylene ether, (ii) a bisphenol polyglycidyl ether, and (iii) aluminum or a zinc salt as a material to improve chemical resistance. Further, European Patent Publication unexamined No. 0 350 696, Japanese Patent Application Laid-Open No. 55722/1990, and U.S. Pat. No. 5,043,367 disclose a resin composition comprising (i) a polyphenylene ether, (ii) an epoxy resin composition containing bromine, (iii) a novolak resin, (iv) an imidazole and a polyamine, (v) a zinc salt, and (vi) $Sb_2O_5$ as a material to give flame retardance.

European Patent Publication unexamined No. 383 178 discloses a resin composition comprising (i) a polyphenylene ether having a low molecular weight, (ii) an epoxy resin composition containing bromine, (iii) an imidazole and a polyamine, and (iv) aluminum or a zinc salt as a material to improve resin flow properties.

As a material which undergoes modification of a polyphenylene ether itself, Japanese Patent Application Laid-Open No. 135216/1990 discloses a resin composition comprising (i) a reaction product of a polyphenylene ether with an unsaturated carboxylic acid or an acid anhydride, (ii) a polyepoxy compound, and (iii) an epoxy cure catalyst, and U.S. Pat. No. 5,001,010 discloses a resin composition comprising (i) a melt processed polyphenylene ether, (ii) a polyepoxy compound, and (iii) an epoxy cure catalyst.

However, these compositions proposed in the above-mentioned patents and patent applications do not show sufficient improvement in resistance to trichloroethylene so that remarkable changes of appearance such as surface roughness and the like in the cured resin compositions are observed when these cured resin compositions are tested in a boiling trichloroethylene.

SUMMARY OF THE INVENTION

With a view toward developing a polyphenylene ether resin composition simultaneously satisfying various property requirements, such as excellent chemical resistance, electrical properties (such as low dielectric constant and low dielectric dissipation factor), fire retardance, dimensional stability, low Z-direction coefficient of thermal expansion and heat resistance, the present inventors have made extensive and intensive studies. As a result, they have unexpectedly found that a curable polyphenylene ether resin composition comprising a reaction product obtained by reaction of a polyphenylene ether with an unsaturated carboxylic acid or an acid anhydride, at least one cyanurate, and optionally an epoxy resin, has excellent storage stability, film-forming properties and melt moldability, and that by curing the curable polyphenylene ether resin composition, a cured polyphenylene ether resin composition having excellent chemical resistance, electrical properties, dimensional stability, Z-direction coefficient of thermal expansion and heat resistance can be obtained. Also, the present inventors have found that the fire retardance and mechanical properties of the polyphenylene ether resin composition are improved, without sacrificing the above-mentioned excellent properties of the composition, by incorporating into the composition a fire retardant and a reinforcement material, respectively. Based on these novel findings, the present invention has been completed.

It is, therefore, an object of the present invention to provide a curable polyphenylene ether resin composition having excellent storage stability, film-forming properties and melt moldability, which can readily be cured.

It is another object of the present invention to provide a cured polyphenylene ether resin composition having excellent chemical resistance, electrical properties (such as low dielectric constant and low dielectric dissipation factor), fire retardance, dimensional stability, low Z-direction coefficient of thermal expansion, and heat resistance, which can advantageously be used as a dielectric material, an insulating material, a heat resistant material and the like in, for example, the electrical and electronic industries, space and aircraft industries, etc.

It is a further object of the present invention to provide a laminate structure comprising a metallic foil and at least one layer of the cured polyphenylene ether resin composition, which can advantageously be used as a single-sided printed circuit board, a double-sided printed circuit board, a multi-layer printed circuit board, a flexible printed circuit board and the like.

The foregoing and other objects, features and advantages of the present invention will be apparent to those skilled in the art from the following detailed description and appended claims.

DETAILED DESCRIPTION OF THE INVENTION

In one aspect of the present invention, there is provided a curable polyphenylene ether resin composition comprising:

(a) 98 to 40% by weight, based on the total weight of components (a) and (b), of a curable polyphenylene ether resin comprising a reaction product obtained by reacting a polyphenylene ether with an unsaturated carboxylic acid or an acid anhydride;

(b) 2 to 60% by weight, based on the total weight of components (a) and (b), of at least one cyanurate selected from the group consisting of triallyl isocyanurate and triallyl cyanurate;

(c) 0 to 90% by weight, based on the total weight of components (a), (b) and (c), of a resin composition comprising an epoxy resin and a curing agent, preferably (i) a brominated bisphenol polyglycidyl ether epoxy resin, (ii) a novolak epoxy resin and (iii) a phenol resin;

(d) 0 to 30% by weight, based on the total weight of components (a), (b), (c) and (d), of a compound having at least one unsaturated double bond and at least one epoxy group; and, (e) 0 to 90% by weight, based on the total weight of components (a), (b), (c), (d) and (e), of a reinforcement material.

A polyphenylene ether employed in the present invention is represented by the following general formula(I):

wherein m is an integer of 1 or 2;

J is a polyphenylene ether chain comprising units represented by the following formula(II):

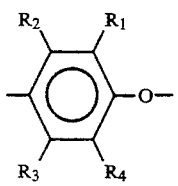
(II)

wherein
- R₁, R₂, R₃ and R₄ each independently represent a lower alkyl group, an alkyl group, a haloalkyl group, a halogen atom or a hydrogen atom;
- Q represents a hydrogen when m is 1, and represents a residue of a bifunctional phenol compound having 2 phenolic hydroxyl groups and having unpolymerizable substituents at the ortho and para positions of the phenolic hydroxyl groups when m is 2.

Examples of lower alkyl groups, R₁, R₂, R₃ and R₄ in the formula (II) include a methyl group, a ethyl group, n-propyl group, isopropyl group, n-butyl group, isobutyl group, sec-butyl group and the like. Examples of aryl groups include a phenyl group and the like. Examples of haloalkyl groups include a bromomethyl group, a chloromethyl group and the like. Examples of halogen atoms include a bromine atom, a chlorine atom and the like.

Representative examples of Q include residues represented by the following formulas (III-a) and (III-b):

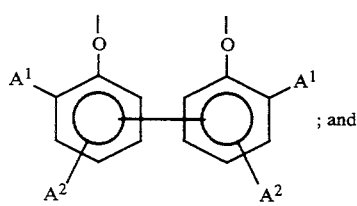
(III-a)

; and

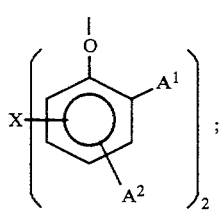
(III-b)

wherein
- A¹ and A² each independently represent a straight chain alkyl group having 1 to 4 carbon atoms;
- X represents an unsubstituted or substituted aliphatic hydrocarbon group, an unsubstituted or substituted aromatic hydrocarbon group, an unsubstituted or substituted aralkyl group, an oxygen atom, a sulfur atom, a sulfonyl group or a carbonyl group; and
- the line representing a bond which crosses the middle point of a side of the benzene ring, as shown for example in

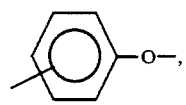

indicates bonding of a substituent at the ortho or para position of the benzene ring with respect to the phenolic hydroxyl group.

Specific examples of Q include residues represented by the following formulas:

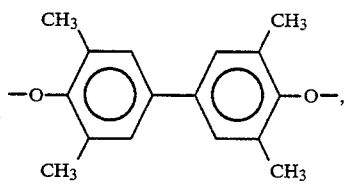

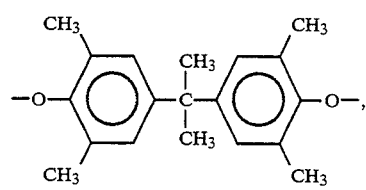

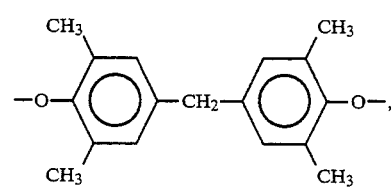

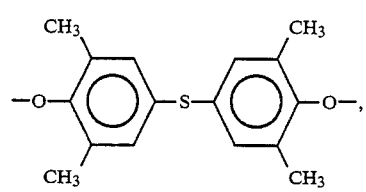

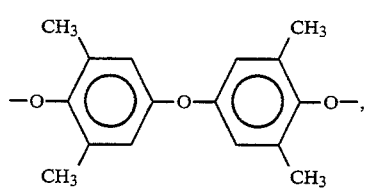

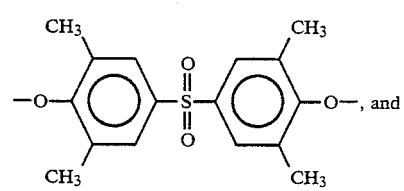, and

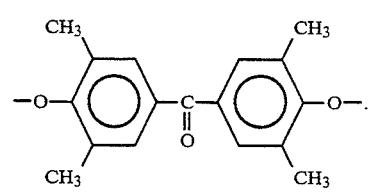.

The polyphenylene ether chain represented by J in the general formula (I) may comprise the unit represented by the following general formula (IV) in addition to the unit represented by the general formula (II).

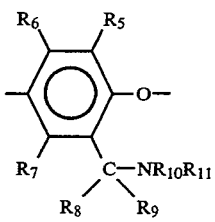
(IV)

wherein
R$_5$, R$_6$, R$_7$, R$_8$ and R$_9$ each independently represent a hydrogen atom, a halogen atom, a lower alkyl group, an aryl group or a haloalkyl group; and
R$_{10}$ and R$_{11}$ each independently represent a hydrogen atom, an alkyl group, a substituted alkyl group, an aryl group or a substituted aryl group but R$_{10}$ and R$_{11}$ do not represent hydrogen atoms at the same time.

Examples of the units of the general formula (IV) include

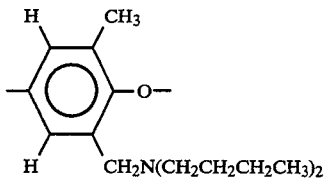

In addition to the above-mentioned units, the polyphenylene ether chain may comprise an unit obtained by graft polymerizing polymerizable monomers having an unsaturated bond such as styrene, methyl methacrylate and the like to units (II) and (IV) represented by the above formulas.

Preferred examples of polyphenylene ether resins of the general formula (I) include poly(2,6-dimethyl-1,4-phenylene ether) obtained by polymerizing 2,6-dimethylphenol alone, a styrene graft copolymer of poly(2,6-dimethyl-1,4-phenylene ether), a copolymer of 2,6-dimethylphenol and 2,3,6-trimethylphenol, a copolymer of 2,6-dimethylphenol and 2-methyl-6-phenylphenol, a multifunctional polyphenylene ether resin obtained by polymerizing 2-methyl-6-phenylphenol in the presence of the bifunctional phenol compound Q (H)$_2$, for example, copolymers comprising units of general formulas (II) and (IV) as disclosed in Japanese Patent Application Laid-Open Nos. 301222/1988 and 297428/1989.

With respect to a molecular weight of the above-mentioned polyphenylene resin, the polyphenylene ether having a viscosity number $\eta sp/c$ of 0.1 to 1.0, which is measured in a 0.5 g/dl chloroform solution at 30° C., is preferably used. As a composition, attaching importance to the melt resin flow, such as a prepreg for a multilayer circuit board, a resin having a small viscosity number is preferred.

The component (a) to be used in the present invention is produced by reacting the above-mentioned polyphenylene ether with an unsaturated carboxylic acid or an acid anhydride. Appropriate examples of unsaturated carboxylic acids and acid anhydrides include acrylic acid, methacrylic acid, maleic anhydride, fumaric acid, itaconic acid, itaconic anhydride, glutaconic anhydride, citraconic anhydride and the like. Of these, maleic anhydride and fumaric acid may be most preferably used. The reaction is conducted by heating the polyphenylene ether resin, and the unsaturated carboxylic acid or acid anhydride in the temperature range of 100° C. to 390° C. In this reaction, a radical initiator may coexist. Both a solution method and a melt mixture method may be used. The melt mixture method is more suitable for the object of the present invention because the method is easily conducted by using an extruder and the like. A ratio of the unsaturated carboxylic acid or the acid anhydride is 0.01 to 5 parts by weight, preferably 0.1 to 3.0 parts by weight, based on 100 parts of the polyphenylene ether.

The curable polyphenylene ether resin compositions of the present invention comprise as another essential component at least one cyanurate selected from the group consisting of triallyl isocyanurate and triallyl cyanurate. Triallyl isocyanurate and triallyl cyanurate are trifunctional monomers respectively represented by the following formulas (V) and (VI):

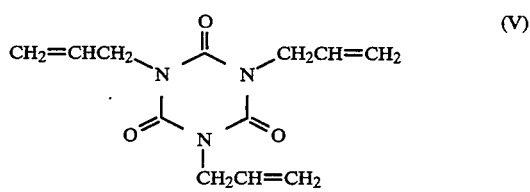
(V)

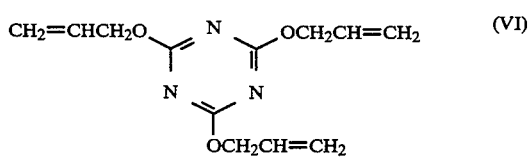
(VI)

In the present invention, triallyl isocyanurate of formula (V) and triallyl cyanurate of formula (VI) may be used individually or in combination. When these are used in combination, the mixing ratio is not critical and can be varied in a wide range.

As an epoxy resin (c) of the present invention, a conventional known one having at least two epoxy groups can be used. Representative examples of the epoxy resin include a glycidyl ether type epoxy resin prepared by a reaction of a phenol or an alcohol with an epichlorohydrine, a glycidyl ester type epoxy resin prepared by a reaction of an amine or a cyanuric acid with epichlorohydrine, an epoxy resin prepared by an oxidation of a double bond in a molecular chain and the like. These may be used in combination. With respect to them, reference may be made to "Epoxy Resin Hand Book" (edited by Mr. Masaki Shinpo) published by Nikkan Kogyo Shimbunsha in 1987, Japan.

In the present invention, among these epoxy resins, a combination of a bisphenol polyglycidyl ether epoxy resin (i) and a novolak epoxy resin (ii) are preferably used in order to obtain improvement of fire retardance, chemical resistance and the like.

A brominated bisphenol polyglycidyl ether epoxy resin (i), which is used as part of the component (c) of the curable polyphenylene ether resin composition in the present invention, may be represented by the following formula (VII):

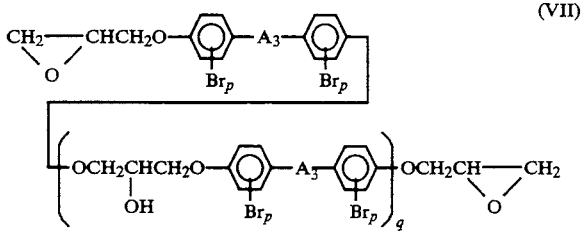

(VII)

wherein p represents an integer of 0 to 4;

q is a number of which average value is 0 to 1;

A₃ represents a lower alkyl group having 1 to 3 carbon atoms.

Of these combinations, the most preferable combination in the present invention is that p is 2; q is substantially 0; and A₃ is an isopropylidene group.

A novolak epoxy resin (ii), which is used as part of the component (c) as well as a brominated bisphenol polyglycidyl, may be represented by the following general formula (VIII):

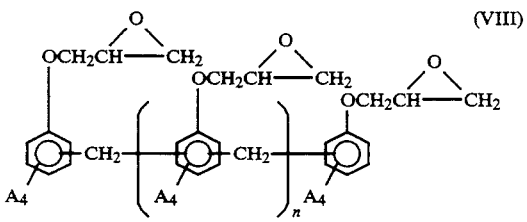

(VIII)

wherein n is a number of which average value is 0 to 10;

A₄ represents a hydrogen atom, a methyl group or a bromine atom.

Of these, it is most preferably used that n is a number of which average value is 0 to 5; A₄ represents a hydrogen atom or a methyl group. These novolak epoxy resins are used individually or in combination.

As a curing agent, there may be used conventional ones for an epoxy resin, e.g., a polyamine type curing agent, an acid anhydride type curing agent, a polyphenol type curing agent, an anionic polymerization catalytic curing agent, a cationic polymerization catalytic curing agent, a latent curing agent and the like. (For detailed descriptions about curing agent, refer to "Epoxy Resin Hand Book" edited by Mr. Masaki Shimpo, published by Nikkan Kogyo Shimbunsha in 1987, "An Introduction to Epoxy Resins" written by Soichi Muroi and Syuichi Ishimura, published by Koubunshi Kankokai and the like.) The curing agent may be used individually or in combination. Of these curing agents, a phenol resin (iii) is preferred.

A phenol resin (iii) preferably has at least two phenolic hydroxyl groups in one molecule and is referred to as a novolak resin and as a resol resin which are synthesized by using phenol, cresol, xylenol, propylphenol, amylphenol, butylphenol, octylphenol, phenylphenol, allylphenol, bisphenol A or the like individually or in combination. Of these, the novolak resin or the resol resin synthesized by using butylphenol or phenylphenol is most preferably used in the present invention because the resin has excellent compatibility with components (a), (b), (c)(i) and (c)(ii). These are used individually or in combination.

As a preferred example of a combination of an epoxy resin and a curing agent, there may be a combination of a brominated bisphenol polyglycidyl epoxy resin (i), a novolak epoxy resin (ii) and a phenol resin (iii).

The brominated bisphenol polyglycidyl ether epoxy resin (i) contributes to fire retardance, and the novolak epoxy resin (ii) contributes to improvement in chemical resistance and heat resistance by increasing a crosslinking density. Further, the phenol resin (iii) serves as a curing agent for these epoxy resins and has a characteristic that the phenol resin is more excellent in storage stability than other curing agents during storage of the mixture states of the resins.

Examples of the component (d) to be used in the present invention, which has at least one epoxy group and at least one unsaturated double bond, include an allylglycidyl ether, glycidylacrylate, glycidylmethacrylate and the like.

The curable polyphenylene ether (hereinafter often referred to simply as "PPE") resin composition of the present invention comprises (a) 98 to 40% by weight, based on the total weight of components (a) and (b), of a curable polyphenylene ether resin and (b) 2 to 60% by weight, based on the total weight of components (a) and (b), of at least one cyanurate selected from the group consisting of triallyl isocyanurate and triallyl cyanurate. When the proportion of component (b) is less than 2% by weight, satisfactory chemical resistance improvement cannot be attained for the cured polyphenylene ether resin composition. On the other hand, when the proportion of component (b) exceeds 60% by weight, there is obtained a cured polyphenylene ether resin composition having unfavorably increased dielectric constant and being extremely brittle. In addition, when the proportions of components (a) and (b) are outside the above-mentioned ranges, a film formed by a casting method, whether the film contains or does not contain a reinforcement material, tends to be very brittle and have a sticky surface.

The proportion of component (c) is in the range of 0 to 90% by weight, preferably 10 to 90% by weight, more preferably 40 to 80% by weight, based on the total weight of components (a), (b) and (c). When the proportion of component (c) exceeds 90% by weight, there is obtained a cured PPE resin composition having unfavorably poor dielectric properties.

The proportions of the brominated bisphenol polyglycidyl ether epoxy resin (i) and the novolak epoxy resin (ii) are determined by the total balance of chemical resistance and fire retardance in the resin composition of the present invention. When the proportion of the novolak epoxy resin increases, chemical resistance improves. However, the brominated bisphenol polyglycidyl ether epoxy resin is preferably used in order that the content of bromine is in the range of 5 to 20% by weight, based on the total weight of components (a), (b) and (c). When the content of bromine exceeds 20% by weight, there is obtained a cured PPE resin composition having unfavorably poor heat stability.

With respect to the proportion of the phenol resin (iii) in component (c), it is preferred that the amount of the phenolic hydroxyl group is controlled in the range of 0.5 to 1.5 equivalent weight, preferably 0.6 to 1.2 equivalent weight per the total amount of the epoxy group in the above mentioned epoxy resin.

The proportion of the component (d) is in the range of 0 to 30% by weight, preferably 0.1 to 20% by weight, more preferably 0.2 to 6% by weight, based on the total weight of components (a), (b), (c) and (d). When the proportion of the component (d) exceeds 30% by weight, satisfactory chemical resistance improvement cannot be attained.

In order to improve the mechanical strength, a reinforcement material may be incorporated as component (e) in the curable PPE resin composition of the present invention comprising components (a) and (b), which has excellent film-forming properties, handling properties, storage stability and melt moldability or in the curable resin composition comprising component (c) or comprising components (c) and (d) in addition to components (a) and (b).

Representative examples of reinforcement materials which may be used in the present invention include glass fabrics, such as glass roving cloth, glass cloth, glass chopped mat, glass surfacing mat and glass nonwoven fabric; ceramic fiber fabrics, asbestos fabrics, metallic fiber fabrics and synthetic or natural inorganic fiber fabrics; woven or non-woven fabrics of synthetic fibers, such as polyvinyl alcohol fiber, polyester fiber, polytetrafluoroethylene fiber, acrylic fiber and aromatic polyamide fiber; natural woven fabrics, such as cotton cloth, hemp cloth and felt; carbon fiber fabrics; and natural cellulosic fabrics, such as kraft paper, cotton paper and glass fiber-containing paper. These reinforcement materials may be used individually or in combination.

In the curable PPE resin composition of the present invention, the amount of component (e) is generally from 0 to 90% by weight, preferably from 5 to 90% by weight, more preferably from 10 to 80% by weight, most preferably from 20 to 70% by weight, based on the total weight of components (a), (b), (c), (d) and (e). From the viewpoints of the dimensional stability and mechanical strength of a final cured PPE resin composition, it is preferred that the amount of component (e) is not less than 5% by weight. On the other hand, when the amount of component (e) exceeds 90% by weight, the dielectric properties of a final cured PPE resin composition are likely to be poor.

Representative examples of metallic foils to be used in the present invention, which constitute the primary metallic foil include a copper foil, an aluminum foil and the like. The thickness of the metallic foil is not specifically limited. Generally, the thickness of the metallic foil may be from 5 to 200 μm, preferably from 5 to 100 μm.

The method for obtaining a resin composition from components (a), (b), (c) and (d) is not critical, and the curable PPE resin composition of the present invention can be obtained for example, by performing melt blending or blending in solution of components (a), (b), (c) and (d). When components (a), (b), (c) and (d) are blended in a mixture, use is made of a solvent selected from the group consisting of halogen-substituted hydrocarbons, such as dichloromethane, chloroform and trichloroethylene, tetrahydrofuran, aromatic hydrocarbons, such as benzene, toluene and xylene, and mixtures thereof.

The curable PPE resin composition of the present invention may be shaped and cured in a predetermined form prior to use in various application fields. The method for shaping is not limited. Generally, the shaping may be conducted by a conventional casting method in which the curable PPE resin composition is dissolved in the above-mentioned solvent and shaped into a predetermined form, or by a conventional heat-melting method in which the curable PPE resin composition is melted by heating and then shaped into a predetermined form.

In the case of the conventional casting method, the curable PPE resin composition may generally be dissolved in the solvent at a concentration of 1 to 50% by weight. The form of the shaped article is not limited. Generally, the curable PPE resin composition of the present invention may be shaped into a sheet or a film. For example, in the case of a film, the solution of the curable PPE resin composition is coated or cast on a substrate, such as a stainless steel plate, a glass plate, a polyimide film, a polyester film or a polyethylene film. The thickness of the solution of the PPE resin composition coated or cast on the substrate is not limited and is generally determined according to the intended thickness of the resultant film and the PPE resin composition concentration of the solution. After coating or casting, the solvent of the solution is removed by air drying, hot-air drying, vacuum drying or the like, to thereby form a film. The film thus formed is peeled off from the substrate. If desired, the film thus obtained may again be subjected to removal of the solvent remaining in the film. However, it is not always required to completely remove the solvent from the film. The removal of the solvent is conducted at a temperature which does not exceed the temperature which the substrate can stand. Generally, the removal of the solvent can be conducted at about 23° C. to about 150° C.

In the case of the heat-melting method, the shaping of the PPE resin composition which is melted by heating may be conducted by a customary melt molding method such as injection molding, transfer molding, extrusion, press molding or the like. The melt molding may generally be conducted at a temperature higher than the glass transition temperature of the curable PPE resin but lower than the temperature at which the curable PPE resin begins to cure.

The above-mentioned casting method and heat-melting method can be used individually. Alternatively, these methods may also be used in combination. For example, it is possible that films of the PPE resin composition are obtained by the casting method and, then, several to several tens of films are piled up and fused with one another by the melt molding method, such as press molding, to thereby obtain a sheet of the PPE resin composition.

The reinforcement material is preferably incorporated in the curable PPE resin composition comprising components (a) and (b) and, optionally, component (c), components (c) and (d), as follows. The curable PPE resin composition is first dissolved in the solvent mentioned above, and, then, the reinforcement material is impregnated with the resultant solution. The impregnation is generally conducted by dipping the reinforcement material in the solution or coating the solution on the reinforcement material.

If desired, the impregnation may be repeated several times or conducted in such a manner that solutions having different formulations and concentrations are prepared and the reinforcement material is treated with the solutions successively so that a predetermined reinforcement material-containing PPE resin composition having a desired resin content is obtained.

The curable PPE resin composition of the present invention is cured for example, by heating, as described hereinbelow. In the curing, crosslinking occurs. In order to lower the reaction temperature and promote the crosslinking reaction of unsaturated double bonds, a radical polymerization initiator may be incorporated in the curable PPE resin composition comprising components of the present invention.

The amount of the initiator which may be used in the present invention is preferably from 0.1 to 10 parts by weight, more preferably from 0.1 to 8 parts by weight, based on 100 parts by weight of the total amount of components (a) and (b).

As the radical polymerization initiator, either a peroxide initiator or a non-peroxide initiator can be used. Representative examples of radical polymerization peroxide initiators include peroxide, such as benzoyl peroxide, cumene hydroperoxide, 2,5-dimethyl-hexane-2,5-dihydroperoxide, 2,5-dimethyl-2,5-di(t-butylperoxy)-hexyne-3, di-t-butyl peroxide, t-butylcumyl peroxide, $\alpha$, $\alpha'$-bis(t-butylperoxy-m-isopropyl) benzene, 2,5-dimethyl-2,5-di(t-butylperoxy)hexane, dicumyl peroxide, di-t-butylperoxy isophthalate, t-butylperoxy benzoate, 2,2-bis(t-butylperoxy)butane, 2,2-bis(t-butylperoxy) octane, 2,5-dimethyl-2,5-di(benzoylperoxy)hexane, di(trimethylsilyl)peroxide and trimethylsilyltriphenylsilyl peroxide and the like. Representative examples of non-peroxide initiators include 2,3-di-methyl-2,3-diphenylbutane and the like. However, the radical polymerization initiators which can be used for curing the curable PPE resin of the present invention are not limited to those mentioned above.

In addition to the above-mentioned radical initiator, an accelerator for curing of an epoxy group may be incorporated in the composition comprising component (c) or comprising components (c) and (d), by adding to the composition comprising components (a) and (b) of the present invention.

As an accelerator for curing, publicly known ones such as an amine compound, an imidazole compound, a heterocyclic compound comprising nitrogen, e.g., diazabicycloundecene, an organic phosphine compound, a complex of an organic phosphine and an organic boron, a complex of an amine and an organic boron, a quaternary ammonium compound, a quaternary phosphonium and the like may be used. See chapter 4 of "Epoxy resin; Recent progress" edited by Hiroshi Kakiuchi, published by Shokodo in 1990, and bibliographies therein for the detailed technology of the accelerator for curing of an epoxy group.

In a case of the composition containing the reinforcement material (e), a coupling agent may be incorporated in the resin components in order to improve bonding ability in the interface between the resin components and the reinforcement material. As a coupling agent, a general coupling agent such as a silane coupling agent, a titanate type coupling agent, an aluminum type coupling agent, zircoaluminate and the like may be used.

In the curable PPE resin composition comprising components (a) and (b), or components (a), (b) and (e), of the present invention, a fire retardant may be incorporated in order to improve the fire retardance of the composition without sacrificing the excellent properties, such as film-forming properties, storage stability and melt moldability. The fire retardant is selected from the group consisting of a phosphorous-containing fire retardant, a chlorine-containing fire retardant and a bromine-containing fire retardant. These may be used in combination. With respect to the fire retardant, reference may be made to "Polymer No Nannenka (Fire retardation of polymer)" by Hitoshi Nishizawa, published by Taiseisha, Japan, in 1987.

Among the fire retardants, the bromodiphenyl ether is most preferred. Representative examples of bromodiphenyl ethers include tetrabromodiphenyl ether, hexabromodiphenyl ether, octabromodiphenyl ether and decabromodiphenyl ether.

In the curable PPE resin composition of the present invention, an auxiliary fire retardant may further be incorporated in order to further improve the fire retardance of the composition, especially the composition containing a reinforcement material described below. Any customary auxiliary fire retardant can be used in the present invention. Preferred are antimony compounds, such as $Sb_2O_3$, $Sb_2O_5$ and $NaSbO_3.1/4H_2O$.

In the curable PPE resin composition of the present invention, if desired, a filler and/or an additive may be incorporated in order to impart additional desired properties to the composition, as long as such a filler and an additive do not adversely affect the properties of the composition. Representative examples of fillers include carbon black, silica, alumina, talc, mica, a glass bead, a hollow glass bead, and the like. Representative examples of additives include an antioxidant, a plasticizer, a pigment, a dye, a colorant and the like. Further, a thermoset resin or a thermoplastic resin such as a PPE can be incorporated individually or in combination.

A cured PPE resin composition is obtained by curing the above-mentioned curable PPE resin composition. A method for curing is optional. The method such as heating, exposing to light, exposing to electron beam and the like may be used.

When a heating method is employed for curing, a temperature depends on whether a radical initiator or a curing agent is present or not, and types thereof. The temperature is selected in the range of 80° to 300° C., preferably 120° to 250° C. The heating period is 1 minute to 10 hours, preferably 1 minute to 5 hours.

The cured PPE resin composition of the present invention can be used as a form of a film and a laminate structure comprising a metallic foil and at least one cured resin composition layer disposed on at least one surface of said metallic foil.

A reinforcement material-containing cured PPE resin composition of the present invention may be prepared, for example, by the following method. A plurality of sheets of a reinforcement material-containing curable PPE resin composition are piled up and subjected to press molding to shape the same while effecting thermal curing, so as to obtain a reinforcement material-containing cured PPE resin composition having a desired thickness. When the reinforcement material-containing curable PPE resin composition sheets are piled up, one or more films which have been shaped from the curable PPE resin composition containing no reinforcement material may optionally be combined with the above-mentioned sheets. Moreover, reinforcement material-containing cured PPE resin compositions having various layer structures may be obtained by subjecting to press molding a composite comprising a reinforcement material-containing cured PPE resin composition and, a curable PPE resin composition and/or a curable PPE resin composition containing no reinforcement material.

The shaping and thermal curing are usually conducted at one time by means of a heat-pressing machine, as mentioned above. However, the shaping and thermal curing may be conducted separately. That is, a shaped composite which has been prepared for example, by piling up and pressing together curable PPE resin compositions, can be subjected to heat treatment and the like, to thereby effect curing. The shaping and thermal curing are generally conducted at a similar temperature range mentioned above under a pressure of 0.1 to 500 kg/cm$^2$ for 1 minute to 10 hours, preferably under a pressure of 1 to 100 kg/cm$^2$ for 1 minute to 5 hours.

In a further aspect of the present invention, there is provided a laminate structure comprising a primary metallic foil layer and at least one cured resin composition layer disposed on at least one surface of the metallic foil. The cured resin composition is a cured polyphenylene ether resin composition as described above. When the laminate structure has at least two cured resin composition layers on at least one surface of the metallic substrate, the cured resin composition layers may be the same or different and are disposed one upon another.

As described above, the laminate structure of the present invention may have one cured resin composition layer. Alternatively, the laminate structure may have at least two cured resin composition layers. When the laminate structure of the present invention has at least two cured resin composition layers, the layers may be either the same or different, and the layers are disposed one upon another.

Further, the cured resin composition layer may be disposed on one surface of the primary metallic foil layer, or may also be disposed on both surfaces of the primary metallic foil layer.

The laminate structure of the present invention may further comprise an additional metallic foil layer. Representative examples of metallic foils which constitute the additional metallic foil layer are the same as those described above with respect to the primary metallic foil. The additional metallic foil layer is disposed on the outer surface of the cured resin composition layer when the laminate structure has one cured resin composition layer on at least one surface of the primary metallic foil. On the other hand, when the laminate structure has at least two cured resin composition layers on at least one surface of the primary metallic foil, the additional metallic foil layer is disposed on the outer surface of an outermost cured resin composition layer and/or between at least one of the cured resin composition layers and a cured resin composition layer adjacent thereto.

The method for producing the laminate structure of the present invention is not specifically limited. For example, the laminate structure may be produced by piling up a predetermined number of films of the curable PPE resin composition of the present invention and metallic foils to form a laminate, and heating the laminate under pressure so as to cure the PPE resin composition films and simultaneously bond the metallic foils to the films. The curable PPE resin composition films may either contain a reinforcement material or not. A curable PPE resin composition film containing a reinforcement material may be used in combination with the curable PPE resin composition containing no reinforcement material. Also, the curable PPE resin composition films may contain a fire retardant or contain a fire retardant and an auxiliary fire retardant.

As mentioned above, an additional metallic foil layer may be provided on one surface of the laminate structure. When the laminate structure comprises at least two cured resin composition layers, additional metallic foil layers may be provided on both surfaces of the laminate structure, and/or an additional metallic foil layer may also be provided as an intermediate layer of the laminate structure.

Further, it is also possible that at least two of the cured laminate structures are disposed one upon another through the curable PPE resin composition layer, followed by curing under pressure.

Moreover, it is possible that the cured laminate structure and a metallic foil are disposed on one another through the curable PPE resin composition or an adhesive, followed by curing under pressure. Examples of adhesives include an epoxy resin adhesive, an acrylic resin adhesive, a phenolic resin adhesive, a cyanoacrylate adhesive and the like. However, the adhesive usable for bonding the metallic foil to the cured laminate structure is not limited to the above-mentioned examples.

The laminate formation and curing of a curable laminate is generally conducted simultaneously by means of a pressing machine. Alternatively, the laminate formation and the curing may be conducted separately. That is, the curable PPE resin compositions and metallic foils are piled up and pressed at relatively low temperature to form an uncured or half-cured laminate which is subjected to heat treatment at relatively high temperature, high energy ray-radiation, etc., to thereby cure the laminate. The heat treatment for curing the uncured or half-cured laminate may generally be conducted at a similar temperature range and a similar pressure range mentioned above.

The laminate structure of the present invention has the above-mentioned excellent properties ascribed to the cured PPE resin composition of the present invention. In addition, the laminate structure has excellent bonding strength between the metallic foil layer and the cured resin composition layer. Especially, when the curable PPE resin composition containing an epoxy resin is used, the bonding strength between the metallic foil layer and the cured resin composition layer is comparable to that of the laminate structure prepared using an epoxy resin only.

The curable polyphenylene ether resin composition of the present invention has features as follows:

1. The curable polyphenylene ether provides advantageously an economical resin composition because the reaction product, which the curable PPE resin comprises, of a polyphenylene ether with an unsaturated carboxylic acid or an acid anhydride is produced at a low price by means of an extruder or the like.
2. The above reaction product has excellent film-forming properties when it is subjected to film casting using a solvent, although the conventional PPE has hardly film-forming properties by solvent casting. Therefore, a film and a composite material are obtained, which have excellent handling properties such as a nonsticky surface, a smooth surface and the like.
3. The curable polyphenylene ether resin composition has excellent flowability when pressed, because the composition comprises a combination of an epoxy resin and a curing agent, preferably specific epoxy resins and a phenol resin, and also comprises triallyl isocyanurate or triallyl cyanurate which has the effect of a plasticizer. Further, the curable PPE resin has more excellent flowability when it comprises component (d).
4. The curable polyphenylene ether resin composition has excellent storage stability. When the curable PPE resin composition is stored at 23° C. for 3 months, the PPE resin maintains excellent flowability. No decrease in properties is observed when the stored resin composition is cured.

5. The curable polyphenylene ether resin composition has excellent heat resistance and chemical resistance when cured, because each component, which the PPE resin composition comprises, has excellent miscibility with each other and the curable PPE resin has one glass transition temperature when cured.

The cured PPE resin composition prepared from components (a) and (b) or components (a), (b) and (e) of the present invention has the following features. Firstly, the cured PPE resin composition has excellent chemical resistance. It is considered that this reason is that triallyl isocyanurate or triallyl cyanurate is uniformly miscible with the reaction product of a polyphenylene ether with an unsaturated carboxylic acid or an acid anhydride to form interpenetrating polymer networks. Secondly, the cured PPE resin composition has excellent dielectric properties. Thirdly, the cured PPE resin composition has excellent heat resistance, particularly, excellent heat resistance in soldering, because no abnormality in its appearance is observed when the cured PPE resin composition is immersed in the bath of molten solder at 260° C. for 120 seconds. When the cured PPE resin composition contains a reinforcement material, the cured PPE resin composition exhibits excellent mechanical properties and dimensional stability in addition to the above-mentioned properties. Further, when a fire retardant and an auxiliary fire retardant, most preferably a polybromodiphenyl ether as a fire retardant and an antimony oxide as an auxiliary fire retardant, are used with a reinforcement material, the cured PPE resin composition becomes a composite material having excellent fire retardance. If a copper foil is laminated on the outermost layer with the composite material, the laminate is used as a copper-clad laminate and the like.

The cured PPE resin composition prepared from components (a), (b) and (c) or components (a), (b), (c) and (e) has the following features.

Firstly, since the cured PPE resin composition comprises components (c), an epoxy resin and a curing agent, the cured PPE resin composition has one glass transition temperature because components (a), (b) and (c) are miscible at the molecular level. The cured PPE resin composition has as high a glass transition temperature as the reaction product of a polyphenylene ether with an unsaturated carboxylic acid or an acid anhydride despite that it comprises an epoxy resin having a low glass transition temperature. Therefore, the cured PPE resin composition has excellent heat resistance in soldering and chemical resistance. Secondly, when the cured PPE resin composition comprises a reinforcement material, the cured PPE resin composition also exhibits excellent mechanical properties dimensional stability and excellent dielectric properties such as a dielectric constant of above 4 because of PPE component. Thirdly, the cured PPE resin composition has an excellent retardance because it comprises epoxy resin containing bromine. Fourthly, the cured PPE resin composition has excellent adhesive properties to a metallic foil and low moisture absorption.

The cured PPE resin composition prepared from components (a), (b), (c) and (d) or components (a), (b), (c), (d) and (e) has more excellent dimensional stability, particularly lower coefficient of thermal expansion in Z-axis direction than the above cured PPE resin composition prepared from components (a), (b), (c) or components (a), (b), (c) and (e) in addition to the feature of the above cured PPE composition. Namely, it is considered that the cured PPE composition may form a denser three dimensional structure because components (a), (b), (c) and (d), which are miscible with each other at the molecular level, make chemical bonds through component (d) between these components by the curing procedure and form a single polymer.

The material of the present invention is advantageously used as a dielectric material, an insulating material, a heat-resistant material and a structural material in the field of electrical and electronic industries, space and aircraft industries, etc. because of the above-mentioned features. Particularly, the material of the present invention is advantageously used as a material for a single-sided printed circuit board, a double-sided printed circuit board, multilayer printed circuit board, a flexible printed circuit board, a semirigid circuit board, a circuit board having a metallic base, a prepreg for a multilayer printed circuit board and the like.

Further, the material of the present invention may be advantageously used as a material for a high density circuit board having not more than 100 $\mu$m of width between circuits, a multilayer circuit board having not more than 200 $\mu$m of thickness of an insulating layer between layers, an adhesive for a packaging circuit board and the like because of heat resistance, low moisture resistance and insulation properties.

DETAILED DESCRIPTION OF THE PREFERRED EMBODIMENTS

Hereinafter, the present invention will be described in more detail with reference to examples, which should not be construed as limiting the scope of the present invention.

Reference Example 1

100 parts by weight of poly(2,6-dimethyl-1,4-phenylene ether) having a viscosity number $\eta sp/c$ of 0.54 as measured in a 0.5g/dl chloroform solution at 30° C., 1.5 parts by weight of maleic anhydride and 1.0 part by weight of 2,5-dimethyl-2,5-di(t-butylperoxy)hexane (Perhexa 25B, manufactured and sold by Nippon Oil & Fats Co., Ltd., Japan) were dry blended at a room temperature, and then the mixture was extruded by a twin-screw extruder under the condition of a cylinder temperature of 300° C. and a screw r.p.m. of 230. The resultant polymer is referred to as Polymer A.

Reference Example 2

100 parts by weight of bifunctional polyphenylene ether (a viscosity number $\eta sp/c$ of 0.40 as measured in a 0.5 g/dl chloroform solution at 30° C.) obtained by oxidative polymerization of 2,6-dimethylphenol in the presence of 2,2-bis(3,5-dimethyl-4 hydroxyphenyl)propane and 2 parts by weight of maleic anhydride were dry blended, and then the mixture was extruded in the same manner as Reference Example 1. The resultant polymer is referred to as Polymer B.

Reference Example 3

100 parts by weight of poly(2,6-dimethyl-1,4-phenylene ether) having a viscosity number $\eta sp/c$ of 0.31 as measured in a 0.5 g/dl chloroform solution at 30° C., 1.5 parts by weight of maleic anhydride and 1.0 part by weight 2,5-dimethyl-2,5-di(t-butylperoxy)hexane (Perhexa 25B, manufactured and sold by Nippon Oil & Fats Co., Ltd., Japan) were dry blended at a room temperature and then the mixture was extruded in the same manner as Reference Example 1. The resultant polymer is referred to as Polymer C.

Each component used in examples described hereinafter was as follows:

Epoxy resin:
(1) Bisphenol A glycidyl ether epoxy resin (AER331, manufactured and sold by Asahi Chemical Industry Co., Ltd., Japan; epoxy equivalent: 189),
(2) Low brominated bisphenol A glycidyl ether epoxy resin (AER711, manufactured and sold by Asahi Chemical Industry Co., Ltd., Japan; epoxy equivalent: 475; bromine content: 20% by weight),
(3) High brominated bisphenol A glycidyl ether epoxy resin (AER735, manufactured and sold by Asahi Chemical Industry Co., Ltd., Japan; epoxy equivalent: 350; bromine content: 48% by weight),
(4) Cresol novolak epoxy resin (ECN273, manufactured and sold by Asahi Chemical Industry Co., Ltd., Japan; epoxy equivalent: 217),
(5) Phenol novolak epoxy resin (EPN1138, manufactured and sold by Ciba-Geigy Japan Ltd., Japan).

Phenol resin:
(1) T-butyl phenol resol resin (PS2657, PS2768, manufactured and sold by Gun-ei Chemical Industry Co., Ltd., Japan),
(2) Phenyl phenol novolak resin (PS2880, manufactured and sold by Gun-ei Chemical Industry Co., Ltd., Japan).

Initiator:
2,5-dimethyl-2,5-di(t-butylperoxy)hexyne-3 (Perhexyne 25B, manufactured and sold by Nippon Oil & Fats Co., Ltd., Japan).

Curing agent except for a phenol resin:
2-methyl-4-methylimidazole: 2E4MZ,
2-methylimidazole: 2MZ,
4,4'-diaminodiphenylmethane: DDM.

Fire retardant:
Decabromodiphenyl ether (AFR-1021, manufactured and sold by Asahi Glass Co., Ltd., Japan).

Auxiliary fire retardant:
$Sb_2O_3$ (PATOX-M, manufactured and sold by Nihon Seiko Co., Ltd., Japan),
$Sb_2O_5$ (NA-4800 manufactured and sold by Nissan Chemical Industry Co., Ltd., Japan).

Glass cloth:
A glass cloth of 48 $g/m^2$ of 105 $g/m^2$, made of E glass,
A glass cloth of 87 $g/m^2$, made of D glass.

EXAMPLES 1 to 7

Each component was dissolved in chloroform according to the formulation shown in Table 1. The mixture was poured on a Teflon (trade mark) plate to form a film. The obtained film had a thickness of about 100 μm and good film-forming properties. Surface tackiness and the like were not observed.

After dried in an air oven, the film was shaped and cured in a vacuum pressing machine to obtain a cured material having a thickness of about 1 mm. In Examples 1 to 4, the film was cured at 200° C. for 30 minutes; in Examples 5 to 7, at 180° C. for 2 hours. When the cured material was boiled in trichloroethylene for 5 minutes, no change was observed in the appearance of the cured material.

Comparative Examples 1 and 2

A polyphenylene ether used as a raw material in Reference Examples 1 and 2, triallyl isocyanurate or triallyl cyanurate and an initiator were blended by using a Henschel mixer according to the formulation shown in Table 1. The mixture was shaped and cured by using a pressing machine at 200° C. for 30 minutes to obtain a cured material having a thickness of about 1 mm. When the cured material was boiled in trichloroethylene for 5 minutes, swelling and warpage were observed.

Comparative Example 3

The same operation as Example 7 was conducted without using triallyl isocyanurate and the initiator. When the obtained cured material was boiled in trichloroethylene for 5 minutes, swelling and warpage were observed.

EXAMPLES 8 to 13

Each component was dissolved or dispersed in trichloroethylene according to the formulation shown in Tables 2 and 3. A glass cloth was immersed in the thus obtained solution to impregnate with the mixture, and dried in an air oven. An E glass cloth of 48 $g/m^2$ was used in Example 8. A D glass cloth of 87 $g/m^2$ was used in Examples 10 to 12. An E glass cloth of 105 $g/m^2$ was used in other examples. All of the obtained curable composite materials did not have surface tackiness and had excellent handling properties.

The above mentioned composite materials were piled to be a thickness of about 0.8 mm when the piled composite materials were cured. A copper foil having a thickness of 35 μm was disposed on each surface of the piled composite materials, and shaped and cured by a pressing machine to obtain a copper clad laminate structure. The curing conditions of each example were shown in Table 4. A pressure was 40 $kg/cm^2$ in all examples. Resin flowability was good in pressing in all the examples.

The properties of the laminate structures obtained in the above-mentioned manner were measured by means of the following methods. As shown in Table 4, gratifying results were obtained.

1. Resistance to Trichloroethylene

A sample having a size of 25 mm × 25 mm was cut out from a laminate structure from which a copper foil had been removed. The sample was immersed in boiling trichloroethylene for 5 minutes. The appearance was examined by visual observation to determine whether or not any change occurred.

2. Dielectric constant and dielectric dissipation factor.

Measurements were conducted at 1 MHz.

3. Heat resistance in solder bath

A sample having a size of 25 mm × 25 mm was cut out from a laminate structure from which a copper foil had been removed. The sample was floated on a molten solder in a solder bath for 120 seconds, which molten solder was heated at 260° C. The appearance was examined by visual observation to determine whether or not any change occurred.

4. Copper foil-peel strength

From a laminate structure, a strip of 20 mm in width and 100 mm in length was cut out. On the copper foil, parallel grooves were provided at an interval of 10 mm. The copper foil between the neighboring grooves was peeled off continuously at a rate of 50 mm/min. in a direction perpendicular to the copper foil surface of the sample. The stress, which occurred when the copper foil was peeled off from the cured resin, was measured by a tensile test machine. The value of the stress, which was measured while the copper was peeled off, was fluctuating. The values of copper foil-peel strength shown in Tables 4, 7, 9 and 11 were the minimum values of the stress.

5. Fire retardance

Measurement of fire retardance was conducted using a test sample having a length of 127 mm and a width of 12.7 mm, according to the test method of UL-94.

Comparative Examples 4 and 5

Laminate structures were prepared in substantially the same manner as Examples 11 and 13 except that triallyl isocyanurate, triallyl cyanurate and an initiator were not used. When resistance to trichloroethylene of the laminate structures was examined, whitening of the surface and exposure of the glass cloths were observed.

EXAMPLES 14 to 16

Each component was dissolved in chloroform according to the formulation shown in Table 5. The mixture was poured on a Teflon (trade mark) plate to form a film. The obtained film had a thickness of about 100 μm and good film-forming properties. Surface tackiness and the like were not observed.

After dried in an air oven, the film was shaped and cured in a vacuum pressing machine at 220° C. for 30 minutes to obtain a cured material having a thickness of about 1 mm. When the cured material was boiled in trichloroethylene for 5 minutes, no change was observed in the appearance of the cured material.

Comparative Example 6

As shown in Table 5, the same manner as Examples 14 to 16 was conducted, except that AER331 as an epoxy resin and 2E4MZ as a curing agent were employed and triallyl isocyanurate or triallyl cyanurate, and an initiator were not employed. When the obtained cured material was boiled in trichloroethylene for 5 minutes, swelling and warpage were observed.

EXAMPLES 17 to 22

Each component was dissolved or dispersed in trichloroethylene according to the formulation shown in Table 6. A glass cloth was immersed in the thus obtained solution to impregnate with the mixture, and dried in an air oven. An E glass cloth of 48 g/m² was used in Example 20. A D glass cloth of 87 g/m² was used in Example 18. An E glass cloth of 105 g/m² was used in other examples. All of the obtained curable composite materials did not have surface tackiness and had excellent handling properties.

The above mentioned composite materials were piled to be a thickness of about 0.8 mm when the piled composite materials were cured. A copper foil having a thickness of 35 μm was disposed on each surface of the piled composite materials, and shaped and cured by a pressing machine to obtain a copper clad laminate structure. The curing conditions of each example were shown in Table 6. A pressure was 40 kg/cm² in all examples. Resin flowability was good in pressing in all the examples.

The properties of the laminate structures obtained in the above-mentioned manner were good as shown in Table 7.

When all the curable composite materials obtained in these examples were stored at 23° C. for 3 months, the curable composite materials maintained good resin flowability. When the stored curable composite materials were made into laminates, deterioration of the properties was not observed.

The spectra of dynamic viscoelasticity of the laminate structures obtained in Examples 17 to 22 were measured. Only one glass transition temperature of 220° C. was observed. This fact suggests that the above-mentioned components were extremely well-miscible. As a result, it is considered that a high glass transition temperature and good chemical resistance may be attained.

Resin melt flowability obtained in Example 17 is defined as follows:

Three sheets of the curable composite material having a size of 10 cm × 10 cm are piled up. The weight of three sheets is referred to as $W_1$. Three sheets of the piled up curable composite material are pressed at 170° C. under a pressure of 22 kg/cm² for 10 minutes. A strip having a size of 10 × 10 cm is cut out from the pressed composite material. The weight of the strip is referred to as $W_2$. Resin melt flowability is calculated according to the following formula:

Resin melt flowability = $(W_1 - W_2) \times 100 / W_1$ (%).

Comparative Examples 7 to 11

The curable composite materials and the laminate structures were prepared according to the formulation shown in Table 6 in the same manner as Examples 17 to 22. When resistance to trichloroethylene of the laminate structures was examined, whitening of the surfaces and exposure of the glass cloths were observed in all Comparative Examples 7 to 11. The laminate structures in Comparative Examples 7 to 11 had two glass transition temperatures. One was ascribed to the glass transition temperature of an epoxy resin. The other was ascribed to the glass transition temperature of a PPE. Whitening of the surfaces was observed in the test of heat resistance in a solder bath in Comparative Examples 7 to 9. When the curable composite materials were stored at 23° C., deterioration of resin flowability in pressing was observed about 1 week later in Comparative Example 10 and about 1 month later in Comparative Example 11.

EXAMPLES 23 to 25

The curable composite materials and the laminate structures were prepared by adding 0.2 part, 5 parts and 0.5 part of allylglycidyl ether to the compositions of Examples 17, 21 and 22 respectively (referred to as Examples 23 to 25 respectively). The laminate structures had the same properties of chemical resistance, heat resistance in a solder bath, dielectric properties and the like as ones in Examples 17, 21 and 22. The laminate structures had the same glass transition temperature of 220° C. as that in Examples 17, 21 and 22. The laminate structures respectively had linear expansions in thickness direction of 156 ppm/°C., 117 ppm/°C. and 120 ppm/°C. The laminate structures had lower coefficient of thermal expansions in thickness direction. They are superior to the laminate structures which do not contain allylglycidyl ether. Therefore, the laminate structures are favorable to creating a multilayer printed circuit board.

EXAMPLES 26 to 31

The curable composite materials and the laminate structures were prepared according to the formulation shown in Table 8 in the same manner as Examples 17 to 22. Table 9 shows that the coefficient of thermal expansion in thickness direction decreases because of the addition of allylglycidyl ether. Therefore, the laminate structure comprising allylglycidyl ether is especially favorable to creating a multilayer printed circuit board.

EXAMPLES 32 to 37

The curable composite materials comprising allylglycidyl ether and the laminate structures comprising allylglycidyl ether were prepared according to the formulation shown in Table 10. In Examples 32 to 34, the same manner as Example 17 was employed. In Examples 35 to 37, the same manner as Example 28 was employed.

It is clear from a comparison between resin melt flowability of 4.0 of Example 17 and those (shown in Table 11) of Examples 32 to 34, and a comparison between resin melt flowability of 6.0 of Example 28 and those (shown in Table 11) of Examples 35 to 37 that resin melt flowability of the curable composite material increased owing to the addition of the allylglycidyl ether. Therefore, printed circuit boards, for which the curable composite material comprising allylglycidyl ether is used, are easily laminated. Further, since the laminate structure made of the curable composite material comprising allylglycidyl ether has low linear expansion, the curable composite material comprising allylglycidyl ether is preferably used for a multilayer printed circuit board.

TABLE 1

| | Composition (Parts by weight) | | | | | | Curing conditions | | Resistance[b] to trichloro-ethylene |
|---|---|---|---|---|---|---|---|---|---|
| | Reaction Product of PPE and maleic anhydride | TAIC/TAC[a] | Epoxy resin | Initiator | Curing Agent | Other component | Temperature (°C.) | Time (hr) | |
| Example 1 | 90 (Polymer B) | 10 (TAIC) | 0 | 3 | 0 | 0 | 200 | 0.5 | ○ |
| Example 2 | 70 (Polymer A) | 30 (TAC) | 0 | 4 | 0 | 0 | 200 | 0.5 | ○ |
| Example 3 | 60 (Polymer A) | 40 (TAC) | 0 | 5 | 0 | 0 | 200 | 0.5 | ○ |
| Example 4 | 50 (Polymer A) | 50 (TAIC) | 0 | 7 | 0 | 0 | 200 | 0.5 | ○ |
| Example 5 | 65 (Polymer B) | 16 (TAIC) | 35 (AER331) | 2.4 | 1.4 (2E4MZ) | 6.5 (Glycidyl methacrylate) | 180 | 2 | ○ |
| Example 6 | 50 (Polymer A) | 12.5 (TAIC) | 50 (AER331) | 1.9 | 2.0 (2E4MZ) | 0 | 180 | 2 | ○ |
| Example 7 | 35 (Polymer A) | 9 (TAIC) | 65 (AER331) | 1.3 | 2.6 (2E4MZ) | 0 | 180 | 2 | ○ |
| Comparative Example 1 | 0 | 10 (TAIC) | 0 | 3 | 0 | 90 (PPE)[c] | 200 | 0.5 | X |
| Comparative Example 2 | 0 | 30 (TAC) | 0 | 4 | 0 | 70 (PPE)[d] | 200 | 0.5 | X |
| Comparative Example 3 | 35 (Polymer A) | 0 | 65 (AER331) | 0 | 2.6 (2E4MZ) | 0 | 180 | 2 | X |

[a]TAIC: Triallyl isocyanurate, TAC: Triallyl cyanurate
[b]○: Appearance was good. X: Swelling and warpage were observed.
[c]Polyphenylene ether produced from a polymer B as a raw material
[d]Polyphenylene ether produced from a polymer A as a raw material

TABLE 2

| | | | Example 8 | Example 9 | Example 10 | Example 11 |
|---|---|---|---|---|---|---|
| Composition (Parts by weight) | Reaction product of PPE and maleic anhydride | | 80 (Polymer C) | 60 (Polymer A) | 50 (Polymer A) | 35 (Polymer A) |
| | TAIC/TAC[a] | | 20 (TAIC) | 40 (TAC) | 50 (TAIC) | 5 (TAC) |
| | Epoxy resin | AER331 | 0 | 0 | 0 | 0 |
| | | AER711 | 0 | 0 | 0 | 45 |
| | | AER735 | 0 | 0 | 0 | 0 |
| | | ECN273 | 0 | 0 | 0 | 20 |
| | Initiator | | 3 | 5 | 8 | 1.2 |
| | Curing agent | | 0 | 0 | 0 | DDM 7.3 2E4MZ 0.13 |
| | Retardant (AFR1021) | | 10 | 10 | 10 | 0 |
| | Auxiliary retardant | Sb₂O₃ | 2 | 2 | 2 | 0 |
| | | Sb₂O₅ | 0 | 0 | 0 | 3 |
| Reinforcement material | Type | | E Glass cloth | E Glass cloth | D Glass cloth | E Glass cloth |
| | Wt % | | 35 | 45 | 45 | 55 |

[a]TAIC: Triallyl isocyanurate, TAC: Triallyl cyanurate

TABLE 3

| | | | Example 12 | Example 13 | Comparative Example 4 | Comparative Example 5 |
|---|---|---|---|---|---|---|
| Composition (Parts by weight) | Reaction product of PPE and maleic anhydride | | 35 (Polymer C) | 50 (Polymer B) | 35 (Polymer A) | 50 (Polymer B) |
| | TAIC/TAC[a] | | 5 (TAIC) | 10 (TAC) | 0 | 0 |
| | Epoxy resin | AER331 | 30 | 5 | 0 | 5 |
| | | AER711 | 0 | 0 | 45 | 0 |
| | | AER735 | 35 | 30 | 0 | 30 |
| | | ECN273 | 0 | 15 | 20 | 15 |
| | Initiator | | 1.2 | 1.8 | 0 | 0 |
| | Curing agent | | 2E4MZ 2.0 | 2MZ 1.0 | DDM 7.3 | 2MZ 1.0 2E4MZ 0.13 |
| | Retardant (AFR1021) | | 0 | 0 | 0 | 0 |

TABLE 3-continued

|  |  |  | Example 12 | Example 13 | Comparative Example 4 | Comparative Example 5 |
|---|---|---|---|---|---|---|
|  | Auxiliary retardant | $Sb_2O_3$ | 0 | 0 | 0 | 0 |
|  |  | $Sb_2O_5$ | 0 | 0 | 3 | 0 |
| Reinforcement material | Type |  | D Glass cloth | E Glass cloth | E Glass cloth | E Glass cloth |
|  | Wt % |  | 55 | 50 | 55 | 50 |

[a] TAIC: Triallyl isocyanurate, TAC: Triallyl cyanurate

TABLE 4

|  | Curing conditions | | Resistance to[a] trichloroethylene | Dielectric constant | Dielectric dissipation factor | Heat resistance[a] in solder bath | Copper foil-peel strength (kg/cm) | Fire retardance UL-94 |
|---|---|---|---|---|---|---|---|---|
|  | Temperature (°C.) | Time (hr) |  |  |  |  |  |  |
| Example 8 | 200 | 0.5 | ○ | 2.8 | 0.002 | ○ | 1.3 | V-0 |
| Example 9 | 200 | 0.5 | ○ | 3.0 | 0.003 | ○ | 1.4 | V-0 |
| Example 10 | 200 | 0.5 | ○ | 2.8 | 0.003 | ○ | 1.4 | V-0 |
| Example 11 | 180 | 2 | ○ | 3.8 | 0.010 | ○ | 2.0 | V-0 |
| Example 12 | 180 | 2 | ○ | 3.6 | 0.008 | ○ | 1.6 | V-0 |
| Example 13 | 180 | 2 | ○ | 3.7 | 0.010 | ○ | 1.8 | V-0 |
| Comparative Example 4 | 180 | 2 | X | 3.8 | 0.010 | ○ | 1.9 | V-0 |
| Comparative Example 5 | 180 | 2 | X | 3.7 | 0.010 | ○ | 1.8 | V-0 |

[a] ○: Appearance was good. X: Whitening of the surface and exposure of the glass cloths were observed.

TABLE 5

|  |  |  | Example 14 | Example 15 | Example 16 | Comparative Example 6 |
|---|---|---|---|---|---|---|
| Composition (Parts by Weight) | Reaction product of PPE and maleic anhydride |  | 60.0 (Polymer B) | 50.0 (Polymer A) | 35.0 (Polymer A) | 35.0 (Polymer A) |
|  | TAIC/TAC[a] |  | 15.0 (TAIC) | 12.5 (TAIC) | 5.0 (TAIC) | 0 |
|  | Epoxy resin | AER735 | 10.0 | 15.0 | 25.0 | 0 |
|  |  | ECN273 | 0 | 18.0 | 18.7 | 0 |
|  |  | EPN1138 | 12.3 | 0 | 0 | 0 |
|  |  | AER331 | 0 | 0 | 0 | 65.0 |
|  | Phenol resin |  | 17.7 (PS2880) | 17.0 (PS2657) | 21.3 (PS2657) | 0 |
|  | Initiator |  | 2.3 | 1.9 | 1.2 | 0 |
|  | Curing agent (2E4MZ) |  | 0.22 | 0.33 | 0.44 | 2.6 |
| Curing conditions | Temperature (°C.) |  | 180 | 180 | 180 | 180 |
|  | Time (hr) |  | 2 | 2 | 2 | 2 |
| Resistance to[b] trichloroethylene |  |  | ○ | ○ | ○ | X |

[a] TAIC: Triallyl isocyanurate TAC: Triallyl cyanurate
[b] ○: Appearance was good. X: Swell and warpage were observed.

TABLE 6

|  |  | Example 17 | Example 18 | Example 19 | Example 20 | Example 21 | Example 22 |
|---|---|---|---|---|---|---|---|
| Composition (Parts by Weight) | Reaction product of PPE and maleic anhydride | 35.0 (Polymer A) | 35.0 (Polymer A) | 35.0 (Polymer C) | 50.0 (Polymer B) | 65.0 (Polymer A) | 80.0 (Polymer A) |
|  | TAIC/TAC[a] | 5.0 (TAIC) | 5.0 (TAIC) | 5.0 (TAC) | 10.0 (TAC) | 11.5 (TAIC) | 14.1 (TAIC) |
|  | Epoxy resin |  |  |  |  |  |  |
|  | AER735 | 25.0 | 25.0 | 25.0 | 15.0 | 10.1 | 7.7 |
|  | ECN273 | 18.7 | 14.8 | 0 | 18.0 | 13.5 | 5.8 |
|  | EPN1138 | 0 | 0 | 17.2 | 0 | 0 | 0 |
|  | AER331 | 0 | 0 | 0 | 0 | 0 | 0 |
|  | AER711 | 0 | 0 | 0 | 0 | 0 | 0 |
|  | Phenol resin | 21.3 (PS2567) | 25.2 (PS2880) | 22.8 (PS2768) | 17.0 (PS2657) | 11.5 (PS2657) | 6.6 (PS2657) |
|  | Initiator | 1.2 | 1.2 | 1.2 | 1.8 | 2.3 | 2.8 |
|  | Curing agent (2E4MZ) | 0.44 | 0.40 | 0.21 | 0.33 | 0.24 | 0.13 |
|  | $Sb_2O_5$ | 0 | 0 | 0 | 3 | 0 | 0 |
| Reinforcement material | Type | E Glass Cloth | D Glass Cloth | E Glass Cloth | E Glass Cloth | E Glass Cloth | E Glass Cloth |
|  | Wt % | 50 | 55 | 55 | 35 | 50 | 41 |
| Bromine content of resin composition (wt %) |  | 11.3 | 11.3 | 11.3 | 6.4 | 4.2 | 3.2 |
|  |  | Comparative Example 7 | Comparative Example 8 | Comparative Example 9 | Comparative Example 10 | Comparative Example 11 |
| Composition (Parts by | Reaction product of PPE | 35.0 (PPE) | 35.0 (PPE) | 40.0 (Polymer A) | 35.0 (Polymer A) | 35.0 (Polymer A) |

TABLE 6-continued

| Weight) | and maleic anhydride | | | | | |
|---|---|---|---|---|---|---|
| | TAIC/TAC[a] | 5.0 (TAIC) | 0 | 0 | 0 | 0 |
| | Epoxy resin | | | | | |
| | AER735 | 25.0 | 25.0 | 0 | 35.0 | 0 |
| | ECN273 | 18.7 | 18.7 | 0 | 0 | 20.0 |
| | EPN1138 | 0 | 0 | 0 | 0 | 0 |
| | AER331 | 0 | 0 | 60.0 | 30.0 | 0 |
| | AER711 | 0 | 0 | 0 | 0 | 45.0 |
| | Phenol resin | 21.3 (PS2657) | 21.3 (PS2657) | 0 | 0 | 0 |
| | Initiator | 1.2 | 0 | 0 | 0 | 0 |
| | Curing agent (2E4MZ) | 0.44 | 0.44 | 7.3 (DDM) | 1.3 | 0.13 (2E4MZ) 7.3 (DDM) |
| | Sb$_2$O$_5$ | 0 | 0 | 0 | 0 | 3 |
| Reinforcement material | Type | E Glass Cloth | E Glass Cloth | E Glass Cloth | E Glass Cloth | E Glass Cloth |
| | Wt % | 55 | 55 | 55 | 55 | 55 |
| Bromine content of resin composition (wt %) | | 11.3 | 11.3 | 0 | 16.6 | 8.4 |

[a]TAIC: Triallyl isocyanurate, TAC: Triallyl cyanurate

TABLE 7

| | Storage Stability[a] of curable composite material | Resin melt flowability | Curing conditions | | Resistance to[b] trichloroethylene | Dielectric constant | Dielectric dissipation factor |
|---|---|---|---|---|---|---|---|
| | | | Temperature (°C.) | Time (hr) | | | |
| Example 17 | ○ | 4 | 180 | 2 | ○ | 3.9 | 0.010 |
| Example 18 | ○ | —[c] | 180 | 2 | ○ | 3.6 | 0.008 |
| Example 19 | ○ | — | 180 | 2 | ○ | 3.9 | 0.010 |
| Example 20 | ○ | — | 180 | 2 | ○ | 3.7 | 0.009 |
| Example 21 | ○ | — | 180 | 2 | ○ | 3.5 | 0.007 |
| Example 22 | ○ | — | 180 | 2 | ○ | 3.4 | 0.005 |
| Comparative Example 7 | ○ | — | 180 | 2 | X | 3.9 | 0.010 |
| Comparative Example 8 | ○ | — | 180 | 2 | X | 3.9 | 0.010 |
| Comparative Example 9 | ○ | — | 180 | 2 | X | 3.8 | 0.009 |
| Comparative Example 10 | X | — | 180 | 2 | X | 3.9 | 0.010 |
| Comparative Example 11 | X | — | 180 | 2 | X | 3.9 | 0.010 |

| | Heat resistance[b] in solder bath | Copper foil-peel strength (kg/cm) | Fire retardance UL-94 | Glass transition temperature (°C.) | Coefficient of thermal expansion in thickness direction (ppm/°C.) |
|---|---|---|---|---|---|
| Example 17 | ○ | 1.9 | V-0 | 220 | 169 |
| Example 18 | ○ | 1.8 | V-0 | 220 | —[c] |
| Example 19 | ○ | 1.9 | V-0 | 220 | — |
| Example 20 | ○ | 1.7 | V-0 | 220 | — |
| Example 21 | ○ | 1.4 | HB | 220 | 160 |
| Example 22 | ○ | 1.3 | HB | 220 | 140 |
| Comparative Example 7 | X | 1.6 | V-0 | 155, 217 | — |
| Comparative Example 8 | X | 1.8 | V-0 | 155, 215 | — |
| Comparative Example 9 | X | 1.9 | HB | 120, 212 | — |
| Comparative Example 10 | ○ | 1.8 | V-0 | 120, 220 | — |
| Comparative Example 11 | ○ | 1.8 | V-1 | 120, 215 | — |

[a]Stored at 23° C. for 3 months
○: Good. X: Decrease of resin flowability was observed.
[b]○: Appearance was good. X: Whitening of the surface and exposure of glass cloths were observed.
[c]—: Not measured.

TABLE 8

| | | Example 26 | Example 27 | Example 28 | Example 29 | Example 30 | Example 31 |
|---|---|---|---|---|---|---|---|
| Composition (Parts by Weight) | Reaction product of PPE and maleic anhydride | 15.0 (Polymer A) | 15.0 (Polymer A) | 30.0 (Polymer A) | 30.0 (Polymer A) | 60.0 (Polymer A) | 60.0 (Polymer A) |
| | TAIC[a] | 5.0 | 5.0 | 10.0 | 10.0 | 20.0 | 20.0 |
| | Epoxy resin | | | | | | |
| | AER735 | 30.0 | 30.0 | 25.0 | 25.0 | 13.5 | 13.5 |
| | ECN273 | 20.0 | 20.0 | 18.7 | 15.1 | 10.1 | 10.1 |
| | EPN1138 | 0 | 0 | 0 | 0 | 0 | 0 |
| | AER331 | 0 | 0 | 0 | 0 | 0 | 0 |

TABLE 8-continued

|  |  | Example 26 | Example 27 | Example 28 | Example 29 | Example 30 | Example 31 |
|---|---|---|---|---|---|---|---|
|  | AER711 | 0 | 0 | 0 | 0 | 0 | 0 |
|  | Phenol resin (PS 2657) | 30.0 | 30.0 | 21.3 | 24.9 | 11.5 | 11.5 |
|  | Allylglycidyl ether | 0 | 5 | 0 | 0.2 | 0 | 5 |
|  | Initiator | 1.6 | 1.6 | 1.8 | 2.45 | 3.6 | 3.6 |
|  | Curing agent (2E4MZ) | 0.38 | 0.38 | 0.31 | 0.31 | 0.17 | 0.17 |
| Reinforcement material | Type Wt % | E Glass Cloth 50 | E Glass Cloth 50 | E Glass Cloth 50 | E Glass Cloth 50 | E Glass Cloth 50 | E Glass Cloth 50 |
| Bromine content of resin composition (wt %) |  | 13.5 | 12.9 | 11.3 | 10.8 | 6.1 | 5.8 |

[a] TAIC: Triallyl isocyanurate

TABLE 9

|  | Storage Stability[a] of curable composite material | Resin melt flowability | Curing conditions | | Resistance to[b] trichloroethylene | Dielectric constant | Dielectric dissipation factor |
|---|---|---|---|---|---|---|---|
|  |  |  | Temperature (°C.) | Time (hr) |  |  |  |
| Example 26 | ○ | —[c] | 180 | 2 | ○ | 4.0 | 0.020 |
| Example 27 | ○ | — | 180 | 2 | ○ | 4.0 | 0.020 |
| Example 28 | ○ | 6 | 180 | 2 | ○ | 3.6 | 0.010 |
| Example 29 | ○ | — | 180 | 2 | ○ | 3.6 | 0.010 |
| Example 30 | ○ | — | 180 | 2 | ○ | 3.5 | 0.007 |
| Example 31 | ○ | — | 180 | 2 | ○ | 3.5 | 0.007 |

|  | Heat resistance[b] in solder bath | Copper foil-peel strength (kg/cm) | Fire retardance UL-94 | Glass transition temperature (°C.) | Coefficient of thermal expansion in thickness direction (ppm/°C.) |
|---|---|---|---|---|---|
| Example 26 | ○ | 2.0 | V-0 | 220 | 165 |
| Example 27 | ○ | 2.0 | V-0 | 220 | 140 |
| Example 28 | ○ | 1.8 | V-0 | 210 | 160 |
| Example 29 | ○ | 1.8 | V-0 | 215 | 150 |
| Example 30 | ○ | 1.6 | V-1 | 220 | 150 |
| Example 31 | ○ | 1.6 | V-1 | 220 | 130 |

[a] Stored at 23° C. for 3 months
○: Good. X: Decrease of resin flowability was observed.
[b] ○: Appearance was good. X: Whitening of the surface and exposure of glass cloths were observed.
[c] —: Not measured.

TABLE 10

|  |  | Example 32 | Example 33 | Example 34 | Example 35 | Example 36 | Example 37 |
|---|---|---|---|---|---|---|---|
| Composition (Parts by Weight) | Reaction product of PPE and maleic anhydride | 35.0 (Polymer A) | 35.0 (Polymer A) | 35.0 (Polymer A) | 30.0 (Polymer A) | 30.0 (Polymer A) | 30.0 (Polymer A) |
|  | TAIC[a] | 5.0 | 5.0 | 5.0 | 10.0 | 10.0 | 10.0 |
|  | Epoxy resin |  |  |  |  |  |  |
|  | AER735 | 25.0 | 25.0 | 25.0 | 25.0 | 25.5 | 25.5 |
|  | ECN273 | 18.7 | 18.7 | 18.7 | 18.7 | 18.7 | 18.7 |
|  | EPN1138 | 0 | 0 | 0 | 0 | 0 | 0 |
|  | AER331 | 0 | 0 | 0 | 0 | 0 | 0 |
|  | AER711 | 0 | 0 | 0 | 0 | 0 | 0 |
|  | Phenol resin (PS 2657) | 21.3 | 21.3 | 21.3 | 21.3 | 21.3 | 21.3 |
|  | Allylglycidyl ether | 5 | 10 | 20 | 5 | 10 | 20 |
|  | Initiator | 1.2 | 1.2 | 1.2 | 1.8 | 1.8 | 1.8 |
|  | Curing agent (2E4MZ) | 0.44 | 0.44 | 0.44 | 0.31 | 0.31 | 0.31 |
| Reinforcement material | Type Wt % | E Glass Cloth 50 | E Glass Cloth 50 | E Glass Cloth 50 | E Glass Cloth 50 | E Glass Cloth 50 | E Glass Cloth 50 |
| Bromine content of resin composition (wt %) |  | 10.7 | 10.1 | 9.2 | 10.6 | 10.1 | 9.3 |

[a] TAIC: Triallyl isocyanurate

TABLE 11

|  | Storage Stability[a] of curable composite material | Resin melt flowability | Curing conditions | | Resistance to[b] trichloroethylene | Dielectric constant | Dielectric dissipation factor |
|---|---|---|---|---|---|---|---|
|  |  |  | Temperature (°C.) | Time (hr) |  |  |  |
| Example 32 | ○ | 5.0 | 180 | 2 | ○ | 3.9 | 0.009 |
| Example 33 | ○ | 6.0 | 180 | 2 | ○ | 4.0 | 0.010 |
| Example 34 | ○ | 10.0 | 180 | 2 | ○ | 4.0 | 0.010 |
| Example 35 | ○ | 20.0 | 180 | 2 | ○ | 3.8 | 0.008 |
| Example 36 | ○ | 20.0 | 180 | 2 | ○ | 3.9 | 0.009 |

TABLE 11-continued

| | | | | | | | |
|---|---|---|---|---|---|---|---|
| Example 37 | ○ | 20.0 | 180 | 2 | ○ | 3.9 | 0.010 |

| | Heat resistance[b] in solder bath | Copper foil-peel strength (kg/cm) | Fire retardance UL-94 | Glass transition temperature (°C.) | Coefficient of thermal expansion in thickness direction (ppm/°C.) |
|---|---|---|---|---|---|
| Example 32 | ○ | 1.8 | V-0 | 220 | 130 |
| Example 33 | ○ | 1.7 | V-0 | 220 | 130 |
| Example 34 | ○ | 1.7 | V-0 | 220 | 135 |
| Example 35 | ○ | 1.9 | V-0 | 220 | 130 |
| Example 36 | ○ | 1.8 | V-0 | 220 | 135 |
| Example 37 | ○ | 1.8 | V-0 | 220 | 135 |

[a]Stored at 23° C. for 3 months
○: Good. X: Decrease of resin flowability was observed.
[b]○: Appearance was good. X: Whitening of the surface and exposure of glass cloths were observed.

What is claimed is:

1. A curable polyphenylene ether resin composition consisting essentially of:
   (a) 98 to 40% by weight, based on the total weight of components (a) and (b), of a curable polyphenylene ether resin comprising a reaction product of a polyphenylene ether with one of an unsaturated carboxylic acid and an acid anhydride;
   (b) 2 to 60% by weight, based on the total weight of components (a) and (b), of at least one cyanurate selected from the group consisting of triallyl isocyanurate and triallyl cyanurate;
   (c) 0 to 90% by weight, based on the total weight of components (a), (b) and (c), of a resin composition comprising an epoxy resin and a curing agent;
   (d) 0 to 30% by weight, based on the total weight of components (a), (b), (c) and (d), of a compound having at least one unsaturated double bond and at least one epoxy group;
   (e) 0 to 90% by weight, based on the total weight of components (a), (b), (c), (d) and (e), of at least one reinforcement material selected from the group consisting of glass fabrics, ceramic fiber fabrics, asbestos fabrics, metallic fiber fabrics synthetic or natural inorganic fiber fabrics, woven or non-woven fabrics of synthetic fibers, natural woven fabrics, carbon fiber fabrics and natural cellulosic fabrics.

2. The curable polyphenylene ether resin composition of claim 1 wherein the amount of each of components (c), (d) and (e) is zero.

3. A film prepared from the curable polyphenylene ether resin composition of claim 2.

4. A cured polyphenylene ether resin composition obtained by curing the curable polyphenylene ether resin composition of claim 2.

5. A film prepared from the curable polyphenylene ether resin composition of claim 4.

6. The curable polyphenylene ether resin composition of claim 1 wherein the amount of component (e) is 5 to 90% by weight, based on the total weight of components (a), (b), (c), (d) and (e), and the amount of each of components (c) and (d) is zero.

7. A cured polyphenylene ether resin composition obtained by curing the curable polyphenylene ether resin composition of claim 6.

8. The curable polyphenylene ether resin composition of claim 1 wherein the amount of component (c) is 10 to 90% by weight, based on the total weight of components (a), (b), (c), (d) and (e), and the amount of each of components (d) and (e) is zero.

9. The curable polyphenylene ether resin composition of claim 1 or claim 8 wherein said epoxy resin comprises a brominated bisphenol polyglycidyl ether resin (i) and a novolak epoxy resin (ii), and said curing agent is a phenol resin (iii) in component (c).

10. The curable polyphenylene ether resin composition of claim 9 wherein a content of bromine is in the range of 5 to 20% by weight.

11. A film prepared from the curable polyphenylene ether resin composition of claim 8.

12. A cured polyphenylene ether resin composition having a single glass transition temperature, obtained by curing the curable polyphenylene ether resin composition of claim 8.

13. A film prepared from the cured polyphenylene ether resin composition of claim 12.

14. The curable polyphenylene ether resin composition of claim 1 or 8 wherein the amount of component (e) is 5 to 90% by weight, based on the total weight of components (a), (b), (c), (d) and (e), and the amount of component (d) is zero.

15. A cured polyphenylene ether resin composition having a single glass transition temperature, obtained by curing the curable polyphenylene ether resin composition of claim 14.

16. The curable polyphenylene ether resin composition claim 1 wherein the amount of component (c) is 10 to 90% by weight and the amount of component (d) is 0.1 to 30% by weight, based on the total weight of components (a), (b), (c), (d) and (e), and the amount of component (e) is zero.

17. The curable polyphenylene ether resin composition of claim 16 wherein said epoxy resin comprises a brominated bisphenol polyglycidyl ether resin (i) and a novolak epoxy resin (ii), and said curing agent is a phenol resin (iii) in component (c).

18. The curable polyphenylene ether resin composition of claim 17 wherein a content of bromine is in the range of 5 to 20% by weight.

19. A film prepared from the curable polyphenylene ether resin composition of any one of claim 16, claim 17 or claim 18.

20. A cured polyphenylene ether resin composition having a single glass transition temperature, obtained by curing the curable polyphenylene ether resin composition of any one of claim 16, claim 17 or claim 18.

21. A film prepared from the cured polyphenylene ether resin composition of claim 20.

22. The curable polyphenylene ether resin composition of any one of claim 1, claim 16, claim 17 or claim 18 wherein the amount of component (e) is 5 to 90% by weight, based on the total weight of components (a), (b), (c), (d) and (e).

23. A cured polyphenylene ether resin composition having a single glass transition temperature, obtained by curing the curable polyphenylene ether resin composition of claim 22.

* * * * *